(12) United States Patent
Song

(10) Patent No.: US 7,998,272 B2
(45) Date of Patent: *Aug. 16, 2011

(54) METHOD OF FABRICATING MULTI-FREESTANDING GAN WAFER

(75) Inventor: In-Jae Song, Yongin-si (KR)

(73) Assignee: Samsung Corning Precision Materials, Co., Ltd., Gumi-si (KR)

( * ) Notice: Subject to any disclaimer, the term of this patent is extended or adjusted under 35 U.S.C. 154(b) by 1053 days.

This patent is subject to a terminal disclaimer.

(21) Appl. No.: 11/598,568

(22) Filed: Nov. 14, 2006

(65) Prior Publication Data

US 2007/0141813 A1    Jun. 21, 2007

(30) Foreign Application Priority Data

Dec. 27, 2005  (KR) .................. 10-2005-0130614

(51) Int. Cl.
*C30B 29/06* (2006.01)
(52) U.S. Cl. ............... 117/81; 117/82; 117/84; 117/87; 438/604
(58) Field of Classification Search ............. 117/81–87; 438/604
See application file for complete search history.

(56) References Cited

U.S. PATENT DOCUMENTS

| | | | |
|---|---|---|---|
| 6,380,108 B1* | 4/2002 | Linthicum et al. | 438/791 |
| 6,413,627 B1* | 7/2002 | Motoki et al. | 428/332 |
| 6,447,604 B1* | 9/2002 | Flynn et al. | 117/89 |
| 6,468,347 B1* | 10/2002 | Motoki et al. | 117/89 |
| 6,579,359 B1* | 6/2003 | Mynbaeva et al. | 117/94 |
| 6,586,778 B2* | 7/2003 | Gehrke et al. | 257/103 |
| 6,924,159 B2* | 8/2005 | Usui et al. | 438/22 |
| 7,118,934 B2* | 10/2006 | Oshima et al. | 438/48 |
| 7,462,893 B2* | 12/2008 | Han et al. | 257/200 |
| 2002/0078881 A1* | 6/2002 | Cuomo et al. | 117/84 |
| 2002/0111044 A1* | 8/2002 | Linthicum et al. | 438/797 |
| 2003/0114017 A1* | 6/2003 | Wong et al. | 438/778 |
| 2004/0183090 A1* | 9/2004 | Kitaoka et al. | 257/103 |
| 2004/0206967 A1* | 10/2004 | Oshima et al. | 257/85 |

(Continued)

OTHER PUBLICATIONS

U.S. Appl. No. 11/545,520, filed Oct. 11, 2006, Jai-Yong Han et al., Samsung Electronics Co., Ltd.

(Continued)

*Primary Examiner* — Robert M Kunemund
(74) *Attorney, Agent, or Firm* — Stein McEwen, LLP

(57) ABSTRACT

A method of fabricating a plurality of freestanding GaN wafers includes mounting a GaN substrate in a reactor, forming a GaN crystal growth layer on the GaN substrate through crystal growth, performing surface processing of the GaN crystal growth layer to form a GaN porous layer having a predetermined thickness on the GaN crystal growth layer, repeating the forming of the GaN crystal growth layer and the forming of the GaN porous layer a plurality of times to form a stack of alternating GaN crystal growth layers and GaN porous layers on the GaN substrate, and cooling the stack such that the GaN layers self-separate to form the freestanding GaN wafers. The entire process of forming a GaN porous layer and a thick GaN layer is performed in-situ in a single reactor. The method is very simplified compared to the prior art. In this way, the entire process is performed in one chamber, and in particular, GaN surface processing and growth proceed using an HVPE process gas such that costs are greatly reduced. In particular, since GaN is self-separated from the substrate through cooling, a GaN wafer of good quality without the occurrence of cracks can be produced on a large scale with a high yield.

25 Claims, 9 Drawing Sheets

U.S. PATENT DOCUMENTS

| | | | |
|---|---|---|---|
| 2005/0023544 A1* | 2/2005 | Shibata | 257/94 |
| 2005/0093003 A1* | 5/2005 | Shibata | 257/79 |
| 2005/0093008 A1* | 5/2005 | Suehiro et al. | 257/98 |
| 2005/0208687 A1* | 9/2005 | Kasai et al. | 438/22 |
| 2006/0097353 A1* | 5/2006 | Motoki et al. | 257/609 |
| 2007/0082465 A1* | 4/2007 | Song et al. | 438/478 |
| 2007/0092980 A1* | 4/2007 | Han et al. | 438/22 |
| 2007/0141813 A1* | 6/2007 | Song | 438/483 |

OTHER PUBLICATIONS

U.S. Appl. No. 11/545,518, filed Oct. 11, 2006, In-Jae Song et al., Samsung Electronics Co., Ltd.

Li et al., In-plane bandgap control in porous GaN through electroless wet chemical etching (vol. 80, No. 6, Feb. 11, 2002, Applied Physics Letters).

Mynbaeva et al., Strain relaxation in GaN Layers grown on porous GaN sublayers (MRS Internet J. Nitride Semicond. Res. 4, 14(1999)).

Oshima et al., Preparation of Freestanding GaN Wafers by Hydride Vapor Phase Epitaxy with Void-Assisted Separation(Jpn. J. Appl. Phys. vol. 42 (2003) pp. L1-L3 Part 2, No. 1A/B, Jan. 15, 2003).

* cited by examiner

GaN(~10μm) GROWTH ON SAPPHIRE

In-situ HCl TREATMENT

THICK GaN GROWTH

REPEAT GROWTH & TREATMENT

COOLING & SEPARATION

FREESTANDING GaN WAFERS

In-situ HCl TREATMENT

REPEAT in-situ GROWTH AND
In-situ HCl TREATMENT

COOLING & SEPARATION

FREESTANDING GaN WAFER

Porous GaN layer (~8um)

METHOD OF FABRICATING MULTI-FREESTANDING GAN WAFER

CROSS-REFERENCE TO RELATED APPLICATIONS

This application claims the benefit of Korean Application No. 2005-130614, filed Dec. 27, 2005, in the Korean Intellectual Property Office, the disclosure of which is incorporated herein by reference.

BACKGROUND OF THE INVENTION

1. Field of the Invention

Aspects of the present invention relate to a method of fabricating a multi-freestanding GaN wafer, and more particularly, to a method of producing a freestanding GaN wafer on a large scale.

2. Description of the Related Art

A variety of methods of fabricating GaN for use in a substrate for a blue and UV-based light emitting device have been proposed. In most conventional methods of fabricating GaN, porous GaN is formed on a substrate, such as an SiC substrate or a sapphire substrate, thick GaN is grown on the porous GaN and is lifted off using a UV laser etc., thereby obtaining freestanding GaN.

Mynbaeva et al. suggest a method of growing GaN on an SiC substrate. In this method, an HF solution is used in a UV excitation atmosphere so that porous GaN is used. Thus, the method requires an additional wet etching process except for a process of forming a layer. As a result, additional processes including a cleaning process are complicated (Strain Relaxation in GaN Layers Grown on Porous GaN Sublayers, MRS Internet J. Nitride Semicond. Res. 4, 14, 1999).

Xiuling Li et al. suggest a method of forming porous GaN using metal-assisted electroless wet etching using metal such as Pt, etc. This method also requires additional processes of forming a metallic layer and etching. Thus, processes are complicated (In-plane Bandgap Control in Porous GaN through Electroless Wet Chemical Etching, Volume 80, Number 6, 11 Feb. 2002, Applied Physics Letters).

As described above, a variety of methods of separating thick GaN grown on another substrate have been proposed. As an example thereof, a UV laser is heated in a state where the entire substrate is heated to about 1000° C. so that GaN is separated from a sapphire substrate, etc. It takes several repetitions to be able to perform the lift-off operation using UV rays and heat. Furthermore, in the conventional lift-off method, for reasons including thermal imbalance, etc., the probability that a GaN layer may be broken during the lift-off operation is high.

Yuichi Oshima et al. suggest a method of void assisted separation (VAS) (Preparation of Freestanding GaN Wafers by Hydride Vapor Phase Epitaxy with Void-Assisted Separation, Jpn. J. Appl. Phys. Vol. 42, 2003, pp. L1-L3, Part 2, No. 1A/B, 15 Jan. 2003). In this method, an ex-situ TiN nanonet is formed on a GaN template substrate so that porous GaN can be easily separated from the GaN template substrate, and then, thick GaN is separately formed. In the method, comparatively good freestanding GaN can be obtained. However, the process is complicated, metallic contamination may occur, and the cost is high.

SUMMARY OF THE INVENTION

Aspects of the present invention provide a method of fabricating a multi-freestanding GaN wafer in which the processes are simple, costs are low and the yield is high.

Aspects of the present invention also provide a method of fabricating a freestanding GaN wafer using a single process.

Aspects of the present invention also provide a method of producing GaN of good quality on a large scale.

According to an aspect of the present invention, there is provided a method of fabricating a multi-plurality of freestanding gallium nitride (GaN) wafers comprising: mounting a GaN substrate in a reactor; forming a GaN crystal growth layer on the GaN substrate through crystal growth; performing surface processing of the GaN crystal growth layer to form a GaN porous layer having a predetermined thickness on the GaN crystal growth layer; repeating the forming of a GaN crystal growth layer and the surface processing of the formed GaN crystal growth layer a plurality of times to form a stack of alternating GaN crystal growth layers and GaN porous layers; and cooling the stack such that the GaN crystal growth layers self-separate into the plurality of freestanding GaN wafers.

According to another aspect of the present invention, there is provided a method of fabricating a plurality of freestanding GaN wafers comprising: mounting a semiconductor substrate in a reactor; forming a GaN crystal growth layer on the semiconductor substrate through crystal growth; performing surface processing of the GaN crystal growth layer to form a GaN porous layer having a predetermined thickness on the GaN crystal growth layer; repeating the forming a GaN crystal growth layer and the surface processing of the formed GaN crystal growth layer a plurality of times to form a stack of alternating GaN crystal growth layers and GaN porous layers on the semiconductor substrate; and cooling the stack such that the GaN crystal growth layers self-separate into the plurality of freestanding GaN wafers.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
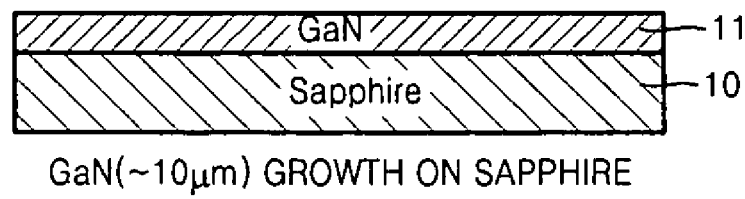
FIGS. 1A through 1H illustrate a method of fabricating a multi-freestanding GaN wafer according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Referring to FIG. 1A, a semiconductor substrate on which a GaN layer 11 is formed, such as, for example, a sapphire substrate 10, is prepared. A GaN substrate or an SiC substrate may also be used as the substrate 10. The sapphire substrate 10 is a starting substrate for growing a crystalline layer. After the sapphire substrate 10 is loaded into a reactor for a hydride vapor phase epitaxy (HVPE) system, a GaCl gas and an $NH_3$ gas are supplied as a source together with an $N_2$ carrier so that the GaN layer 11 is grown to a thickness of less than 10 μm on the surface of the sapphire substrate 10. Alternatively, a substrate on which a GaN layer is formed is prepared by metal-organic chemical vapor deposition (MOCVD).

Figure 1B:
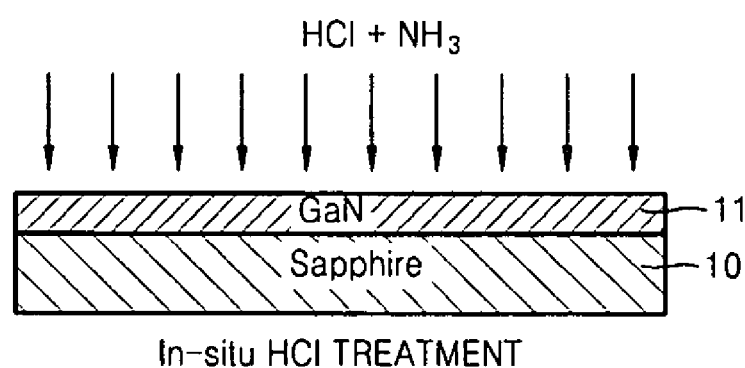
Figure 1C:
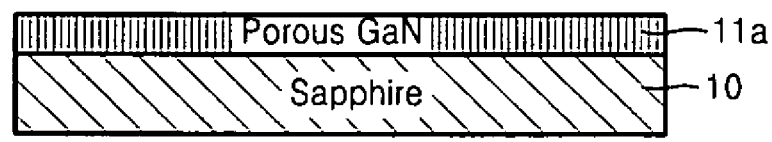

Referring to FIG. 1B, after the growth of the GaN layer 11 is completed, the HCl gas and the $NH_3$ gas are supplied into the reactor so that the surface of the GaN layer is processed in-situ. By the surface processing, a GaN porous layer 11a is formed on the surface of the substrate 10, as illustrated in FIG. 1C.

Figure 1D:
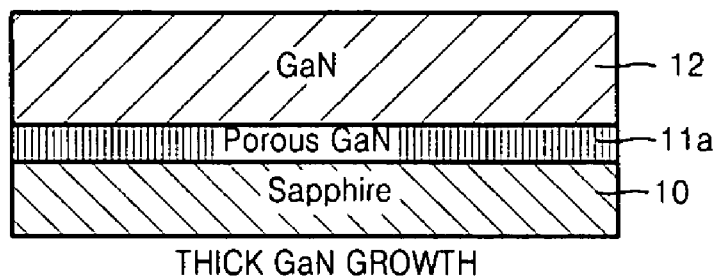

Referring to FIG. 1D, an in-situ thick GaN crystal growth process is performed in the reactor. To this end, a Ga source gas and an N source gas are supplied so that a thick GaN layer 12 is formed on the GaN porous layer 11a using a well-known method.

Figure 1E:
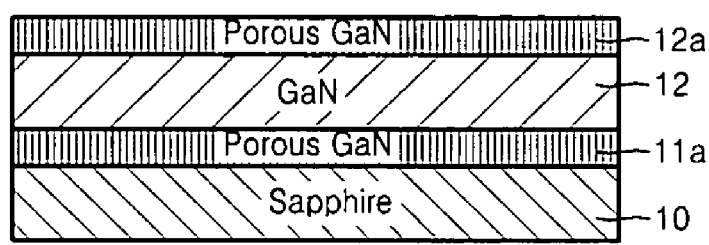

Referring to FIG. 1E, the surface of the GaN layer 12 is processed in the HCl gas and the $NH_3$ gas atmosphere so that the GaN porous layer 12a is formed on the GaN layer 12 by etching.

Figure 1F:
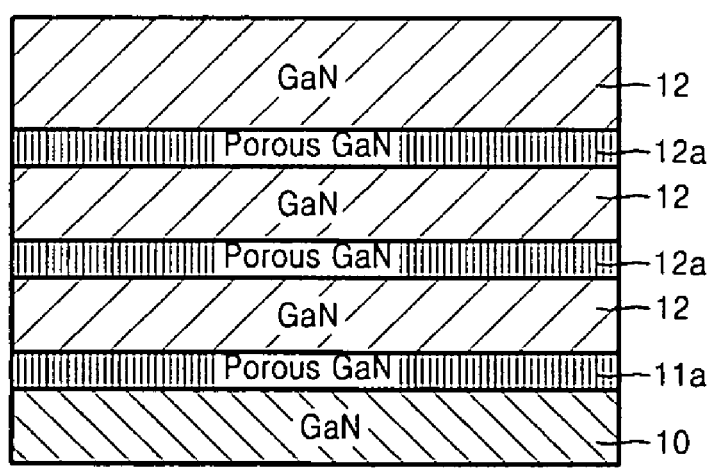

Referring to FIG. 1F, a process of forming the GaN layer 12 and a process of forming the GaN porous layer 12a through surface processing of the GaN layer 12 are repeatedly performed for a predetermined time period or for a predetermined number of repetitions so that a stack with alternating GaN layers and GaN porous layers is formed.

Figure 1G:
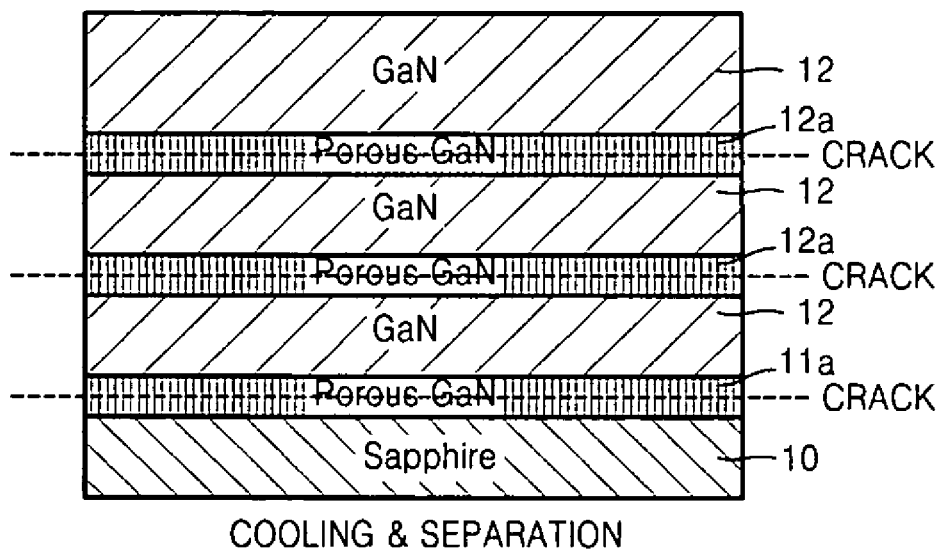
Figure 1H:
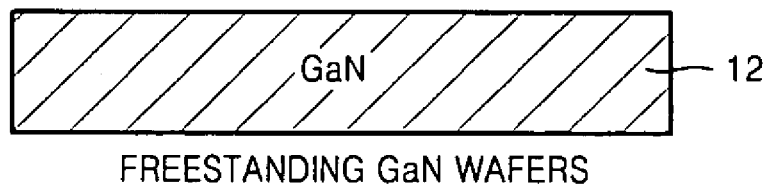

Referring to FIG. 1G, the substrate 10 and the stack formed thereon are cooled down in the reactor. Cooling may be natural cooling. In other words, the cooling can be carried out by ceasing to apply heat to the reactor such that the reactor cools naturally to room temperature. However, other methods of cooling may be used. During or after the cooling, cracks may form in the GaN porous layers 11a and 12a so that the GaN layers 12 can be easily separated from the substrate 10 and separated from each other. Referring to FIG. 1H, the separated GaN layers 12 are freestanding GaN wafers that may be used in the manufacture of semiconductor devices. The separated GaN layers 12 may be polished in a well-known process. For example, if an irregular surface is present on a separated GaN crystal growth layer 12 where the GaN crystal growth layer 12 was attached to the substrate 10 or to another GaN crystal growth layer through the porous GaN layer 11a, due, for example, to the presence of some material from the porous GaN layer remaining on the surface of the GaN crystal growth layer, such an irregular surface can be smoothed by polishing.

The following embodiment illustrates a process in which a GaN substrate is used as a starting substrate for forming a thick GaN layer.

Figure 2A:
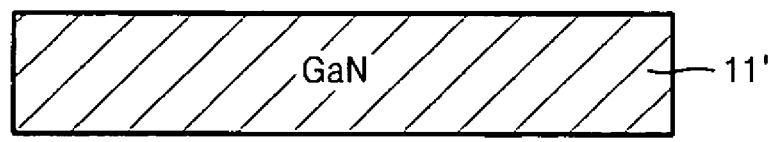
FIGS. 2A through 2H illustrate a method of fabricating a multi-freestanding GaN wafer according to another embodiment of the present invention.

Referring to FIG. 2A, a GaN substrate 11' is loaded into the reactor for the HVPE system.

Figure 2B:
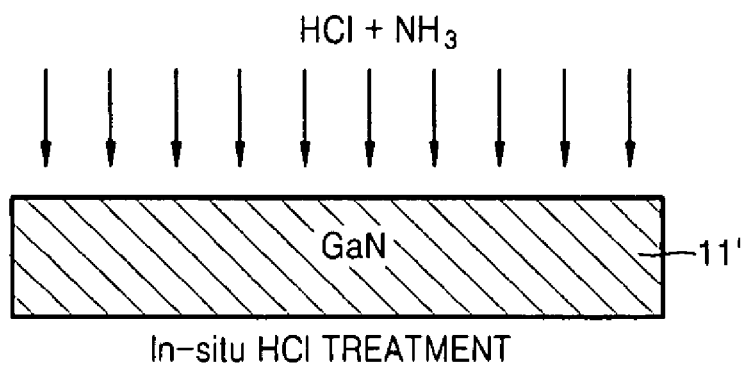
Figure 2C:
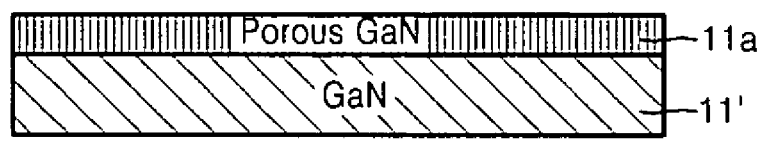

Referring to FIG. 2B, an HCl gas and an $NH_3$ gas are injected into the reactor so that the surface of the GaN substrate 11' is processed. According to the surface processing, the GaN porous layer 11 a is formed on the surface of the GaN substrate 11', as illustrated in FIG. 2C.

Figure 2D:
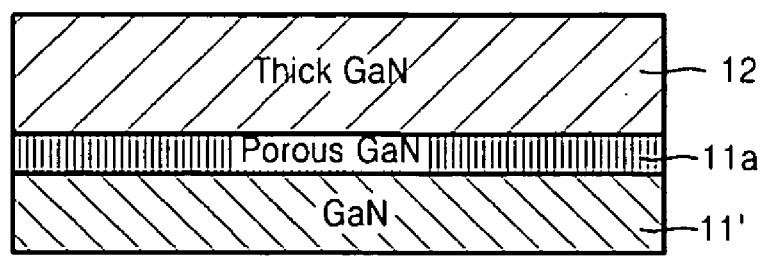

Referring to FIG. 2D, a source for GaN crystal growth is supplied into the reactor so that a thick GaN layer 12 is formed on the GaN porous layer 11a.

Figure 2E:
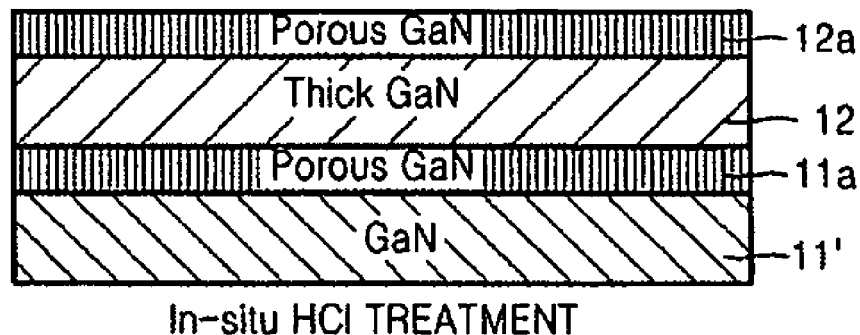

Referring to FIG. 2E, the HCl gas and the $NH_3$ gas are injected into the reactor so that the GaN porous layer 12a is formed on the surface of the GaN layer 12.

Figure 2F:
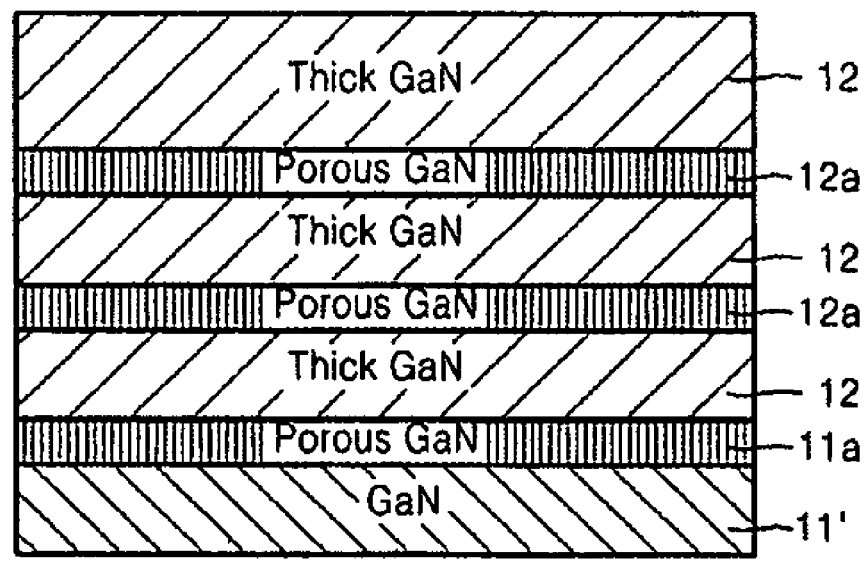

Referring to FIG. 2F, the process of forming the GaN layer 12 and the process of forming the GaN porous layer 12a through surface processing of the GaN layer 12 are repeatedly performed for a predetermined time period or for a predetermined number of repetitions so that a stack of alternating GaN layers and GaN porous layers are formed.

Figure 2G:
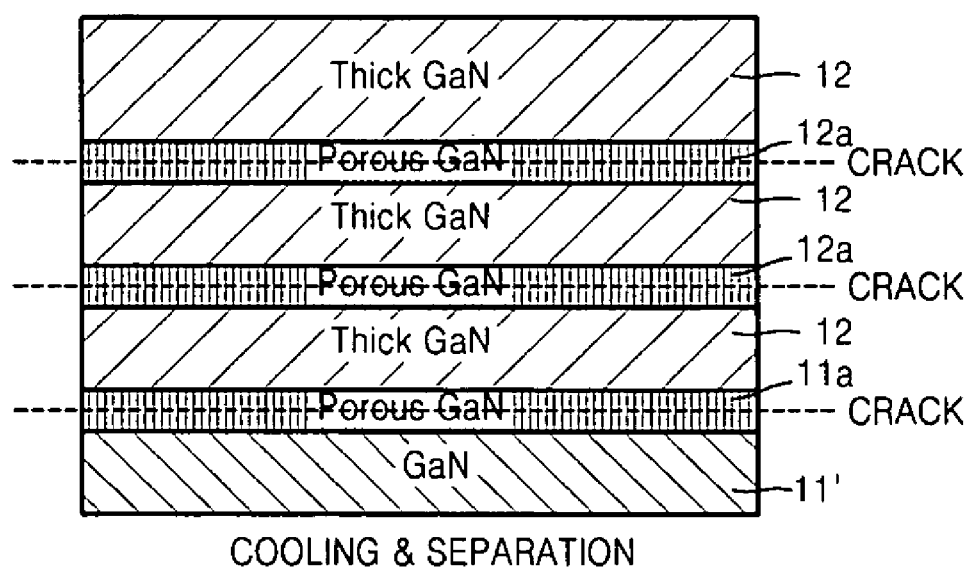
Figure 2H:
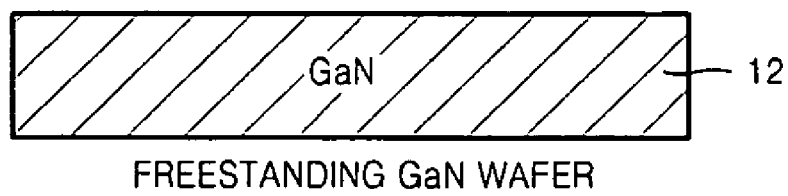

Referring to FIG. 2G, the substrate 11' is cooled down in the reactor. After cooling, the GaN layers 12 are easily separated from the substrate 11'. Referring to FIG. 2H, the separated GaN layers 12 are freestanding GaN wafers that may be used in the manufacture of semiconductor devices. The separated GaN layers 12 may be polished like in a general process.

In the methods described above, a substrate on which a GaN porous layer is formed may be a semiconductor substrate such as a GaN wafer or a sapphire substrate.

The facility used in the above process may be a hydride vapor phase expitaxy (HVPE) system. Growth of porous GaN and thick GaN may be continuously performed in-situ in the facility. Conditions for forming porous GaN will now be described.

Figure 3:
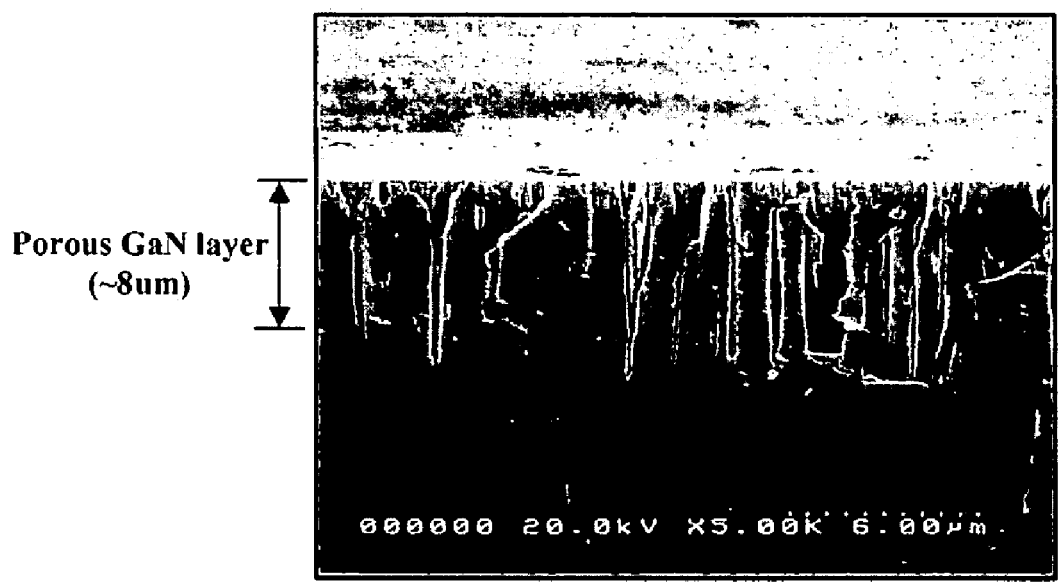
FIG. 3 shows a scanning electron microscope (SEM) image of porous GaN fabricated according to the method illustrated in FIGS. 1A through 1H.

A vertical HVPE system is used in surface processing of GaN. After the temperature of a reactor for the HVPE system is raised up to 900-1200° C., or as a more particular, non-limiting example, up to 1000° C., and then a gas needed in surface processing of GaN is flowed out to the reactor together with an $N_2$ carrier gas for several minutes. In this case, an HCl gas and an $NH_3$ gas are used. At this time, 50-150 sccm of HCl and 500-1500 sccm of $NH_3$, or as a more particular, non-limiting example, 100 sccm of HCl and 1000 sccm of $NH_3$, are supplied. At the same time, about 8000 sccm of $N_2$ carrier gas is supplied at atmospheric pressure. When this gas composition is supplied, decomposition of Ga is performed on the surface of a GaN substrate or a GaN layer and a GaCl gas and an $H_2$ gas are generated and exhausted so that voids having a predetermined depth are formed in the surface of GaN. FIG. 3 shows a scanning electron microscope (SEM) image of porous GaN on a GaN wafer obtained using the surface processing conditions. As illustrated in FIG. 3, a GaN porous layer is formed in GaN to a thickness of about 8 microns.

Subsequent to formation of the porous GaN, a GaCl gas and an $NH_3$ gas are properly supplied to the reactor in which surface processing has proceeded to form porous GaN, using a well-known method so that a thick GaN layer can be grown on the porous GaN.

Figure 4A:
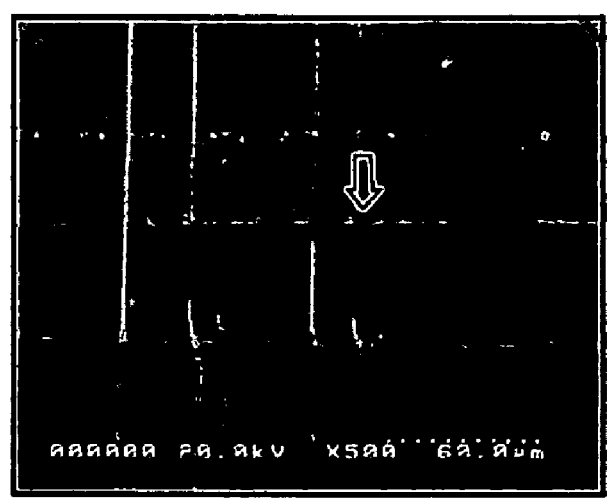
FIG. 4A shows an SEM image of a porous GaN/thick GaN layer fabricated according to the method illustrated in FIGS. 1A through 1H.
Figure 4B:
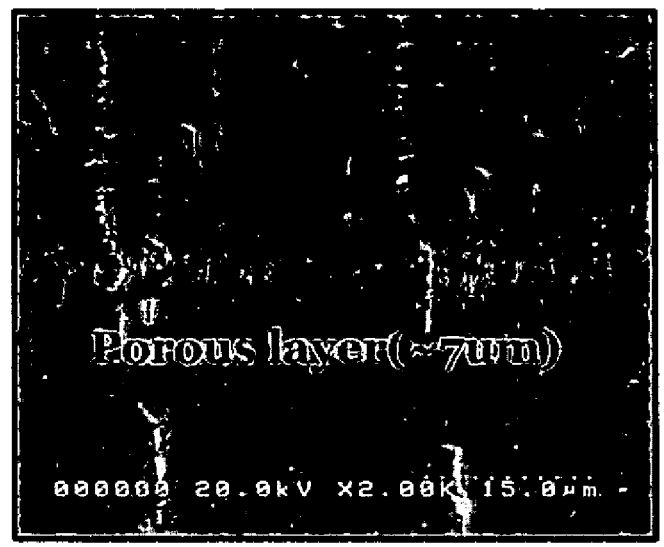
FIG. 4B shows a partially enlarged SEM image of the porous GaN layer illustrated in FIG. 4A.
Figure 4C:
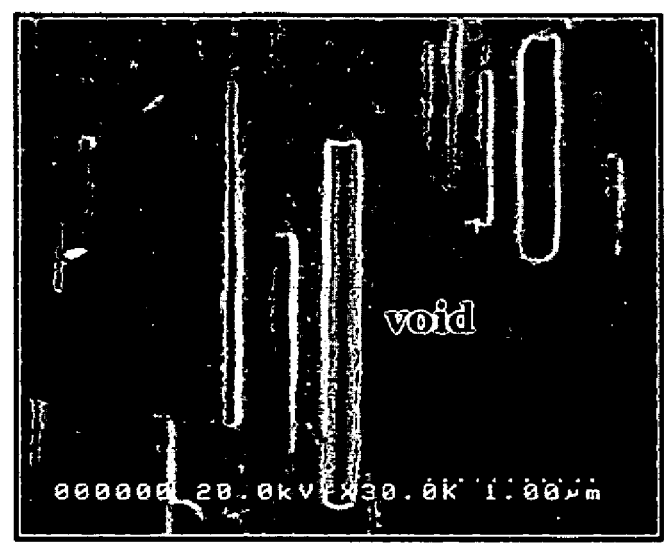
FIG. 4C shows an enlarged SEM image of a dotted-line rectangular edge illustrated in FIG. 4B.

FIG. 4A shows an SEM image of a sample in which thick GaN is grown on porous GaN. In FIG. 4A, the arrow represents a GaN porous layer. FIG. 4B shows a partially enlarged SEM image of a GaN porous layer of the sample illustrated in FIG. 4A. The bright band in the middle of FIG. 4B indicates a GaN porous layer. The GaN porous layer has a thickness of about 7 microns. FIG. 4C is a more enlarged view of the GaN porous layer, which shows a void formed in the porous GaN layer.

Figure 5:
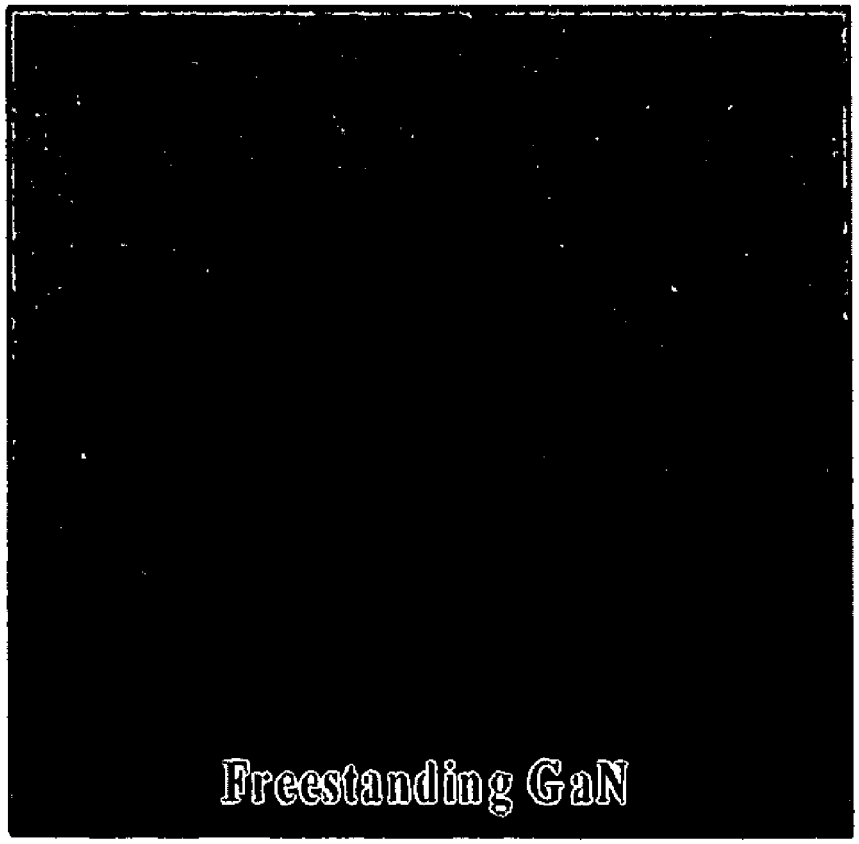
FIG. 5 shows an image of a freestanding GaN wafer fabricated according to the method illustrated in FIGS. 1A through 1H.

The thick GaN formed on the GaN porous layer is separated from the starting substrates 10 and 10' through self separation after cooling. FIG. 5 shows a freestanding GaN substrate that has self-separated after cooling. A force applied in the separation of the GaN substrate is conducive to separation of the thick GaN.

According to aspects of the present invention described above, the entire process of forming a GaN porous layer and a thick GaN layer is performed in-situ in a single reactor, and the thick GaN layer is self-separated through cooling without the occurrence of cracks. The method according to aspects of the present invention is very simplified compared to the prior art. In this way, the entire process is performed in one chamber, and in particular, GaN surface processing and growth proceed using an HVPE process gas such that costs are greatly reduced. In particular, since GaN is self-separated without the occurrence of cracks, the process time is very short and the yield is also high.

Aspects of the present invention can be applied to the manufacture of a large-scale GaN freestanding substrate, and in particular, a GaN substrate having a thickness of several microns can be fabricated in an economical manner.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of fabricating a plurality of freestanding gallium nitride (GaN) wafers comprising:
    mounting a GaN substrate in a reactor;
    forming a GaN crystal growth layer on the GaN substrate through crystal growth;
    performing surface processing of the GaN crystal growth layer to form a GaN porous layer having a predetermined thickness on the GaN crystal growth layer;
    repeating the forming of a GaN crystal growth layer and the surface processing of the formed GaN crystal growth layer a plurality of times to form a stack of alternating GaN crystal growth layers and GaN porous layers on the GaN substrate; and
    cooling the stack such that the GaN crystal growth layers self-separate into the plurality of freestanding GaN wafers.

2. The method of claim 1, wherein the surface processing is performed by supplying an HCl gas and an $NH_3$ gas into the reactor.

3. The method of claim 2, wherein 50-150 sccm of HCl gas and 500-1500 sccm of $NH_3$ gas are supplied into the reactor at a room pressure.

4. The method of claim 3, wherein each forming of a GaN porous layer proceeds at a temperature of 900-1200° C.

5. The method of claim 1, wherein the forming of the stack of alternating GaN crystal growth layers and GaN porous layers is carried out at an elevated temperature and wherein the cooling of the stack is carried out by allowing the stack to cool naturally to room temperature.

6. The method of claim 1, wherein the reactor is a hydride vapor phase epitaxy (HVPE) system reactor.

7. The method of claim 6, further comprising performing surface processing of the GaN substrate before forming the GaN growth layer on the GaN substrate to form a GaN porous layer on the surface of the GaN substrate.

8. The method of claim 1, further comprising performing surface processing of the GaN substrate before forming the GaN growth layer on the GaN substrate to form a GaN porous layer on the surface of the GaN substrate.

9. The method of claim 1, wherein the forming of the GaN crystal growth layer on the GaN substrate through crystal growth, performing of the surface processing of the GaN crystal growth layer to form the GaN porous layer having a predetermined thickness on the GaN crystal growth layer, and repeating the forming of a GaN crystal growth layer and the surface processing of the formed GaN crystal growth layer a plurality of times to form the stack of alternating GaN crystal growth layers and GaN porous layers on the GaN substrate are carried out in situ in a single reactor.

10. The method of claim 1, wherein the cooling of the stack is carried out such that the porous GaN layers fracture to allow the GaN growth layers to be separated into the plurality of freestanding GaN wafers.

11. The method of claim 1, further including polishing at least one of the plurality of freestanding GaN wafers.

12. A method of fabricating a plurality of freestanding GaN wafers comprising:
    mounting a semiconductor substrate in a reactor;
    forming a GaN crystal growth layer on the semiconductor substrate through crystal growth;
    performing surface processing of the GaN crystal growth layer to form a GaN porous layer having a predetermined thickness on the GaN crystal growth layer;
    repeating the forming a GaN crystal growth layer and the surface processing of the formed GaN crystal growth layer a plurality of times to form a stack of alternating GaN crystal growth layers and GaN porous layers on the semiconductor substrate; and
    cooling the stack such that the GaN crystal growth layers self-separate into the plurality of freestanding GaN wafers.

13. The method of claim 12, wherein the semiconductor substrate is a sapphire substrate, a GaN substrate, an SiC substrate, or a GaAs substrate.

14. The method of claim 13, wherein the surface processing is performed by supplying an HCl gas and an $NH_3$ gas into the reactor.

15. The method of claim 12, wherein the surface processing is performed by supplying an HCl gas and an $NH_3$ gas into the reactor.

16. The method of claim 15, wherein 50-150 sccm of HCl gas and 500-1500 sccm of $NH_3$ gas are supplied into the reactor at a room pressure.

17. The method of claim 16, wherein the forming of the GaN porous layer proceeds at a temperature of 900-1200° C.

18. The method of claim 15, wherein the forming of the GaN porous layer proceeds at a temperature of 900-1200° C.

19. The method of claim 12, wherein the forming of the stack of alternating GaN crystal growth layers and GaN porous layers is carried out at an elevated temperature and wherein the cooling of the stack is carried out by allowing the stack to cool naturally to room temperature.

20. The method of claim 12, wherein the reactor is a reactor for a hydride vapor phase epitaxy (HVPE) system.

21. The method of claim 17, wherein the reactor is a reactor for an HVPE system.

22. The method of claim 18, wherein the reactor is a reactor for an HVPE system.

23. The method of claim 12, wherein the forming a GaN crystal growth layer on the semiconductor substrate through crystal growth, performing surface processing of the GaN crystal growth layer to form the GaN porous layer having a predetermined thickness on the GaN crystal growth layer, and repeating the forming of a GaN crystal growth layer and the surface processing of the formed GaN crystal growth layer a plurality of times to form the stack of alternating GaN crystal growth layers and GaN porous layers on the GaN substrate are carried out in situ in a single reactor.

24. The method of claim 12, wherein the cooling of the stack is carried out such that the porous GaN layers fracture to allow the GaN growth layers to be separated into the plurality of freestanding GaN wafers.

25. The method of claim 12, further including polishing at least one of the plurality of freestanding GaN wafers.

* * * * *

UNITED STATES PATENT AND TRADEMARK OFFICE
CERTIFICATE OF CORRECTION

| | | |
|---|---|---|
| PATENT NO. | : 7,998,272 B2 | Page 1 of 1 |
| APPLICATION NO. | : 11/598568 | |
| DATED | : August 16, 2011 | |
| INVENTOR(S) | : In-jae Song | |

It is certified that error appears in the above-identified patent and that said Letters Patent is hereby corrected as shown below:

Title Page
  References Cited (56), Col. 1,
    U.S. Patent Documents, 6th reference down 6,586,778    7/2003    "Gehrke et al." should be --Linthicum et al.--.

Signed and Sealed this
Twenty-fifth Day of October, 2011

David J. Kappos
*Director of the United States Patent and Trademark Office*